United States Patent

Oae et al.

Patent Number: 5,264,706
Date of Patent: Nov. 23, 1993

[54] ELECTRON BEAM EXPOSURE SYSTEM HAVING AN ELECTROMAGNETIC DEFLECTOR CONFIGURED FOR EFFICIENT COOLING

[75] Inventors: Yoshihisa Oae; Akio Yamada; Hiroshi Yasuda, all of Kawasaki, Japan

[73] Assignee: Fujitsu Limited, Kawasaki, Japan

[21] Appl. No.: 874,138

[22] Filed: Apr. 27, 1992

[30] Foreign Application Priority Data

Apr. 26, 1991 [JP] Japan ............................... 3-97320
May 30, 1991 [JP] Japan ............................. 3-127902

[51] Int. Cl.$^5$ .................................................. H01J 3/32
[52] U.S. Cl. ........................ 250/492.2; 250/396 ML; 335/210
[58] Field of Search .................... 250/492.2 R, 396 R, 250/396 ML, 492.1, 492.22, 492.3; 313/412, 414; 315/370; 335/210

[56] References Cited

U.S. PATENT DOCUMENTS

| | | | |
|---|---|---|---|
| 3,916,201 | 10/1975 | Herrmann et al. | 250/396 ML |
| 4,661,709 | 4/1987 | Walker et al. | 250/396 R |
| 4,758,810 | 7/1988 | Tamura | 335/210 |
| 4,902,898 | 2/1990 | Jones et al. | 250/492.2 |
| 5,051,600 | 9/1991 | Schuetz et al. | 250/492.3 |
| 5,118,949 | 6/1992 | Rappat et al. | 250/396 R |
| 5,136,166 | 8/1992 | Young | 250/396 ML |

*Primary Examiner*—Paul M. Dzierzynski
*Assistant Examiner*—Jim Beyer
*Attorney, Agent, or Firm*—Staas & Halsey

[57] ABSTRACT

An electron beam exposure system comprises a beam source for producing and directing an electron beam along an optical axis, an evacuated column for accommodating the beam source and extending along the optical axis, an electron lens for focusing the electron beam on a substrate; and an electromagnetic deflector supplied with a control signal for deflecting the electron beam in response to the control signal. The electromagnetic deflector comprises an inner sleeve surrounding the evacuated column, first and second mutually separate windings provided on an outer surface of the inner sleeve in opposed relationship with respect to each other across the optical axis, an outer sleeve surrounding the inner sleeve with a separation therebetween defining a passageway for the flow of a coolant therethrough; third and fourth, mutually separate windings provided on an inner surface of the outer sleeve in opposed relationship with respect to each other across the optical axis, an inlet for introducing the coolant into the passageway, and an outlet for exiting the coolant from the passageway.

7 Claims, 7 Drawing Sheets

ELECTRON BEAM EXPOSURE SYSTEM HAVING AN ELECTROMAGNETIC DEFLECTOR CONFIGURED FOR EFFICIENT COOLING

BACKGROUND OF THE INVENTION

The present invention relates in general to fabrication of semiconductor devices and in particular to an electron beam exposure system for writing a semiconductor pattern on a semiconductor substrate by an electron beam.

For purposes of submicron patterning of semiconductor devices, an electron beam exposure system is well suited. The electron beam exposure system uses a finely focused electron beam for writing a semiconductor pattern on a semiconductor substrate and can achieve a resolution of less than 1 $\mu$m without difficulty. In order to achieve a desired large demagnification as well as improved resolution, recent electron beam exposure systems use a very strong electron lens, thereby to permit decreasing the focal length of the electron lens. By decreasing the focal length, one can minimize the adverse effect of Coulomb interaction between the electrons. Thereby, the resolution of exposure is improved.

In such an electron beam exposure system that uses the strong electron lens, one needs an electromagnetic deflector that can produce a correspondingly strong magnetic field for deflecting the electron beam. As a result, cooling of the electromagnetic deflector becomes an acute problem for the stability of deflection operation. It should be noted that the electromagnetic deflector has to be formed as small as possible for increasing the intensity of the magnetic field, and such a small electromagnetic deflector can easily cause a temperature rise due to the Joule heating. When the temperature of the electromagnetic deflector has increased, there occurs a problem of drift of the electron beam. In order to avoid this problem, the conventional electromagnetic deflectors have an arrangement for cooling the windings.

Before describing the construction of the conventional electromagnetic deflector, a brief summary will be made on the construction of a conventional electron beam exposure system with reference to FIG. 1.

FIG. 1 shows the construction of a conventional electron beam exposure system that uses the technique of block exposure. Referring to the drawing, the electron beam exposure system generally comprises an electron optical system 100 for producing and focusing an electron beam and a control system 200 for controlling the optical system 100.

The electron optical system 100 includes an electron gun 104 as a source of the electron beam. The electron gun 104 includes a cathode electrode 101, a grid electrode 102 and an anode electrode 103, and produces the electron beam generally in the direction of a predetermined optical axis O and in the form of a spreading beam.

The electron beam thus produced by the electron gun 104 is passed through a shaping aperture 105a formed in an aperture plate 105. The aperture plate 105 is provided such that the aperture 105a therein is in alignment with the optical axis O and shapes the incident electron beam so as to have a rectangular cross section.

The electron beam thus shaped is received by an electron lens 107a that has a focal point coincident with the aperture 105a. Thereby, the incident electron beam is converted to a parallel beam and enters into an electron lens 107b that focuses the electron beam on a block mask 110. It should be noted that the lens 107b projects the image of the rectangular aperture 105a on the block mask 110. As shown in FIG. 2, the block mask 110 carries a number of fundamental patterns 1a, 1b, 1c, ..., of the semiconductor device pattern to be written on the substrate, in the form of apertures, and shapes the electron beam according to the shape of the selected aperture through which the electron beam passes.

In order to deflect the electron beam, which has passed through the electron lens 107b, and thereby to address the desired aperture, deflectors 111, 112, 113 and 114 are provided, wherein the deflector 111 deflects the electron beam away from the optical axis O in response to a control signal SM1. The deflector 112 in turn deflects the electron beam back generally into parallel relationship with the optical axis O, in response to a control signal SM2. After passing through the block mask 110, the deflector 113 deflects the electron beam toward the optical axis O in response to a control signal SM3, and the deflector 114 deflects the electron beam such that the electron beam travels in coincidence with the optical axis O, in response to a control signal SM4. Further, the block mask 110 itself is movable in the direction perpendicular to the optical axis O for enabling the addressing of the apertures on the entire surface of the block mask 110 by the electron beam.

The electron beam which thus has passed through the block mask 110 is then focused at a point f1 that is located on the optical axis O, after passing through electron lenses 108 and 116. There, the image of the addressed aperture on the block mask 110 is demagnified at the point f1. The electron beam thus focused is then passed through a blanking aperture 117a formed in a blanking plate 117 and, further, is focused on the surface of a substrate 123 that is held on a movable stage 126, after passing through electron lenses 119 and 120 that form another demagnifying optical system. There, the electron lens 120 serves as an objective lens and includes various coils, such as correction coils 120 and 121 for focusing compensation and stig compensation as well as deflection coils 124 and 125 for moving the focused electron beam over the surface of the substrate 123.

It should be noted that the foregoing blanking aperture 117a is so as to be coincident with the optical axis O for establishing an alignment of the electron beam therewith. For this purpose, various adjustment coils 127–130 are provided. Thus, at the beginning of the exposure, the electron beam is turned on and the arrival of the electron beam at the stage 126 is detected while controlling the adjustment coils 127–130. During this procedure, the mask 110 may be removed from the optical path O for free passage of the electron beam. Alternatively, a large aperture, provided in the mask 110 for passing the electron beam free therethrough, may be used.

FIG. 1 illustrates the operational state of the electron beam exposure system wherein the electron beam is focused at the surface of the substrate 123. In this state, the focusing point f1 of the optical system comprising the lenses 108 and 116 is located above the blanking aperture plate 117 for achieving the desired demagnification.

In order to control the exposure operation, the electron beam exposure system of FIG. 1 includes the control system 200, wherein the control system 200 includes memory devices, such as a magnetic tape device 201 and magnetic disk devices 202, 203, that are provided to store various data of the device pattern of the semiconductor device to be written. In the illustrated example, the magnetic tape device 201 is used for storing various design parameters, the magnetic disk device 202 is used for storing the exposure pattern data, and the magnetic disk device 203 is used for storing the pattern of the apertures on the block mask 110.

The data stored in the memory devices is read out by a CPU 204 and transferred to an interface device 205 after data decompression. There, the data for specifying the pattern on the block mask 110 is extracted and stored in a data memory 206. The data stored in the data memory 206 is then transferred to a first control unit 207 that produces the foregoing control signals SM1–SM4 and supplies the same to the deflectors 111–114. Further, the control unit 207 produces and supplies a control signal to a mask moving mechanism 209 that moves the block mask 110 in the direction transverse to the optical path O. In response to the deflection of the optical beam by the deflectors 111–114 and further in response to the lateral movement of the block mask 110, one can address the desired aperture on the mask 110 by the electron beam.

The first control unit 207 further supplies a control signal to a blanking control unit 210 that in turn produces a blanking signal for shutting off the electron beam. This blanking signal is then converted to an analog signal SB in a D/A converter 211 and the analog signal SB is supplied to a deflector 115 that causes a deflection of the electron beam away from the optical axis O. In response to this, the electron beam misses the blanking aperture 117a and thus is not incident on the surface of the substrate 123. Further, the control unit 207 produces pattern correction data $H_{ADJ}$ and supplies the same to a D/A converter 208. The D/A converter 208 in turn produces a control signal $S_{ADJ}$ and supplies the same to a deflector 106 that is provided between the electron lens 107a and the electron lens 107b. Thereby, one can modify the shape of the electron beam which has passed through the addressed aperture in the mask 110. This function is used when the desired shape of the electron beam is different from the shape given by the apertures on the block mask 110.

The interface device 205 further extracts and supplies the data, for controlling the movement of the electron beam on the surface of the substrate 123, to a second control unit 212. In response thereto, the control unit 212 produces a control signal for controlling the deflection of the electron beam on the surface of the substrate 123 and supplies the same to a wafer deflection control unit 215 that in turn produces and supplies deflection control signals to D/A converters 216 and 217. The D/A converters 216 and 217 in turn produce drive signals SW1 and SW2 for driving the deflectors 124 and 125, respectively and supply the same to the deflectors 124 and 125 for causing the deflection of the electron beam. Thereby, the position of the stage 126 is detected by a laser interferometer 214 and the wafer deflection control unit 215 modifies the output deflection control signals and hence the drive signals SW1 and SW2 according to the result of measurement of the stage position by the laser interferometer. Further, the second control unit 212 produces a control signal that causes a lateral movement of the stage 126.

FIG. 2 shows the construction of an electromagnetic deflector 30 used in the electron beam exposure system of FIG. 1. The electromagnetic deflector may be used for the deflector 124, for example, in combination with the strong objective lens 122.

Referring to FIG. 2, the electromagnetic deflector 30 includes a first cylindrical bobbin 35 of an insulating material such as a glass. The bobbin 35 has a cylindrical outer surface and a corresponding inner surface, wherein two opposing windings 31 and 32 are provided, similarly to two opposing saddles, on the outer surface of the bobbin 35. Each of the windings 31 and 32 includes a conductor wire such as copper provided along the outer surface of the bobbin and produces a magnetic field such that the electron beam is deflected in the X-direction.

The bobbin 35 is disposed within another cylindrical bobbin 36 of an insulating material, such as glass, and carries also a pair of opposing windings 33 and 34 on an outer cylindrical surface like a saddle. The windings 33 and 34 are disposed perpendicular to the windings 31 and 32 and produce a magnetic field that deflects the electron beam in the Y-direction. Further, the outer bobbin 36 is provided with a number of slits 39 affording coolant passageways as will be described later. FIG. 3(A) shows the windings 31–34 of the electromagnetic deflector of FIG. 2. As can be seen in this drawing, the windings 31 and 32 are in opposed relationship with respect to each other in the X-direction while the windings 33 and 34 are in opposed relationship with respect to each other in the Y-direction.

When using the electromagnetic deflector in combination with a strong electron lens such as the objective lens 122, the electromagnetic deflector is required to produce a strong magnetic field in correspondence to the strong magnetic field of the electron lens. It should be noted that the electron lens converges the electron beam by the strong magnetic field, while the electromagnetic deflector deflects the electron beam against the converging action of the electron lens. In order to produce a strong magnetic field, it is necessary to form the diameter of the bobbins 35 and 36 as small as possible. See FIGS. 2 and 3(B). By reducing the diameter while maintaining the number of turns of the windings, one can increase the strength of the magnetic field such that the electromagnetic deflector can deflect the electron beam even under the very strong magnetic field of the electron lens. In a typical example, the bobbins 35 and 36 have outer diameters of 30 mm and 35 mm, respectively.

On the other hand, such a reduction of the size of the windings of the electromagnetic deflector raises a problem of Joule heating of the windings. It should be noted that one has to use a wire of smaller diameter for the smaller bobbins in order to create the magnetic field with the necessary field strength. On the other hand, the use of such thin wires for the windings 31–34 inevitably increases the Joule heating of the electromagnetic deflector. Typically, a current of about 1 A is needed for deflecting the electron beam by a distance of 2.5 mm. When a region of 10 mm×10 mm is to be covered by the deflection of the electron beam, a current of about ±2 A is needed for driving the windings of each bobbin. When each winding has a resistance of about 1 Ω, in correspondence to the use of a wire with a diameter of 0.5 mmφ, a Joule heating of about 4 watts is expected for each of the inner and outer bobbins.

When such extensive heating occurs, the geometrical relationship between the windings and the optical axis O deviates from the designed state, and the drift of the electron beam occurs on the surface of the substrate. For example, a copper winding may have a thermal expansion coefficient of $1.7\times10^{-5}$, while a ceramic bobbin may have a thermal expansion coefficient of about $8\times10^{-6}$. In such a case, a temperature rise of 10° C. can be expected to cause a deviation of the geometry of 0.34 $\mu$m for the winding and 0.16 $\mu$m for the bobbin in the worst case. When such a deviation occurs, there can be a deviation of the electron beam of as much as 0.4 $\mu$m on the surface of the substrate. Thereby, the submicron patterning is no longer possible.

In order to avoid the unwanted heating of the electromagnetic deflector, cooling of the windings is necessary. For this purpose, the conventional electromagnetic deflector uses a construction shown in FIG. 4 wherein the windings 31-34 are cooled by a coolant such as air, water or other suitable medium.

Referring to FIG. 4 showing a part of the electron beam exposure system of FIG. 1, there is provided an evacuated column 37 along the optical axis O for passing the electron beam from the electron beam source 104 to the substrate 123. Along the column 37, it can be seen that there are provided three electromagnetic deflectors 30a, 30b and 30c, each having a construction shown in FIG. 2. There, the bobbins 35 and 36 are positioned concentrically around the column 37, and a magnetic pole piece 38 of the electron lens such as the objective lens 122 surrounds the deflectors 30a-30c as indicated in the drawing. Thereby, there is formed a space between the column 37 and the pole piece 38, and a coolant such as the ambient air is introduced into the space for cooling the deflectors 30a-30c held on the column 37.

There, the coolant is introduced at the bottom part of the pole piece 38 and flows in the upward direction along the inner wall of the pole piece 38 until it exits at the top part of the pole piece 38. Thereby, the coolant cools the outer windings 33 and 34 as it flows past the electromagnetic deflectors 30a-30c. Further, the coolant enters into the space formed between the outer bobbin 36 and the inner bobbin 35 through the slit 39 and cools the windings 31 and 32 on the inner bobbin 35. The coolant which thus enters into the space between the outer bobbin 36 and the inner bobbin 35 exits again via the slit 39 after cooling the windings 31, 32, and flows upwardly until exiting at the coolant exit provided at the top part of the pole piece 38.

In this conventional construction, there exists a problem in that the efficiency of cooling, particularly of the inner windings 31 and 32, becomes poor when the size of the deflector becomes small, as shown in FIG. 3(B). It should be noted that the space between the inner bobbin and the outer bobbin is reduced, commensurate with the reduced size of the electromagnetic deflector, and the supply of sufficient coolant into such a space becomes difficult. Another factor that restricts the efficient cooling is that the slit 39 tends to be covered by the windings 33, 34 particularly when the sizes of the bobbins 35 and 36 are reduced, and thus become smaller. It should be noted that the size of the slit 19 becomes inevitably smaller with the reduced size of the bobbins 35 and 36 while the number of turns of the windings cannot be reduced while still achieving the desired strong magnetic field inside the column 37.

Thus, the conventional construction of the electromagnetic deflectors cannot eliminate the problem of Joule heating of the windings and hence the unwanted drift of the electron beam. In fact, a temperature rise of 2°-3° C. is observed in the electromagnetic deflector of FIG. 2. Thus, one has to wait until the electron beam settles each time the electron beam is deflected, and the efficiency of electron beam exposure process becomes inevitably deteriorated.

SUMMARY OF THE INVENTION

Accordingly, it is a general object of the present invention to provide a novel and useful electron beam exposure system, wherein the foregoing problems are eliminated.

Another and more specific object of the present invention is to provide an electron beam exposure system having an electromagnetic deflector with an improved efficiency of cooling.

Another object of the present invention is to provide an electron beam exposure system, comprising beam source means for producing an electron beam such that the electron beam travels toward a substrate along a predetermined optical axis; focusing means for focusing the electron beam on said substrate; and an electromagnetic deflector supplied with a control signal for deflecting said electron beam in response to said control signal; said electromagnetic deflector comprising: an inner sleeve surrounding a path of said electron beam; first and second, mutually separate windings provided on an outer surface of said inner sleeve, said first and second windings being disposed in opposed relationship with respect to each other in a first direction that is substantially perpendicular to said optical axis of the electron beam; an outer sleeve surrounding said inner sleeve with a separation therefrom and accordingly with a space therebetween said outer sleeve and said inner sleeve defining a coolant passageway therebetween; third and fourth, mutually separate windings provided on an inner wall of said outer sleeve opposed relationship with respect to each other in a second direction that is different from said first direction and is substantially perpendicular to said optical axis; inlet means for introducing a coolant into said passage; and outlet means for exiting said coolant from said passage. According to the present invention, the first through fourth windings are cooled efficiently by flowing a coolant through the space formed between said inner sleeve and said outer sleeve. It should be noted that the first through fourth windings are exposed to said space and hence to the coolant that flows through said space. Thereby, not only the windings on the outer sleeve but also the windings on the inner sleeve are cooled efficiently, and the problem of drift of the electron beam due to the heating of the electromagnetic deflector is minimized. As a consequence, one can maximize the efficiency of the exposure operation.

Other objects and further features of the present invention will become apparent from the following detailed description when read in conjunction with the attached drawings.

DETAILED DESCRIPTION OF THE PREFERRED EMBODIMENTS

Figure 5:
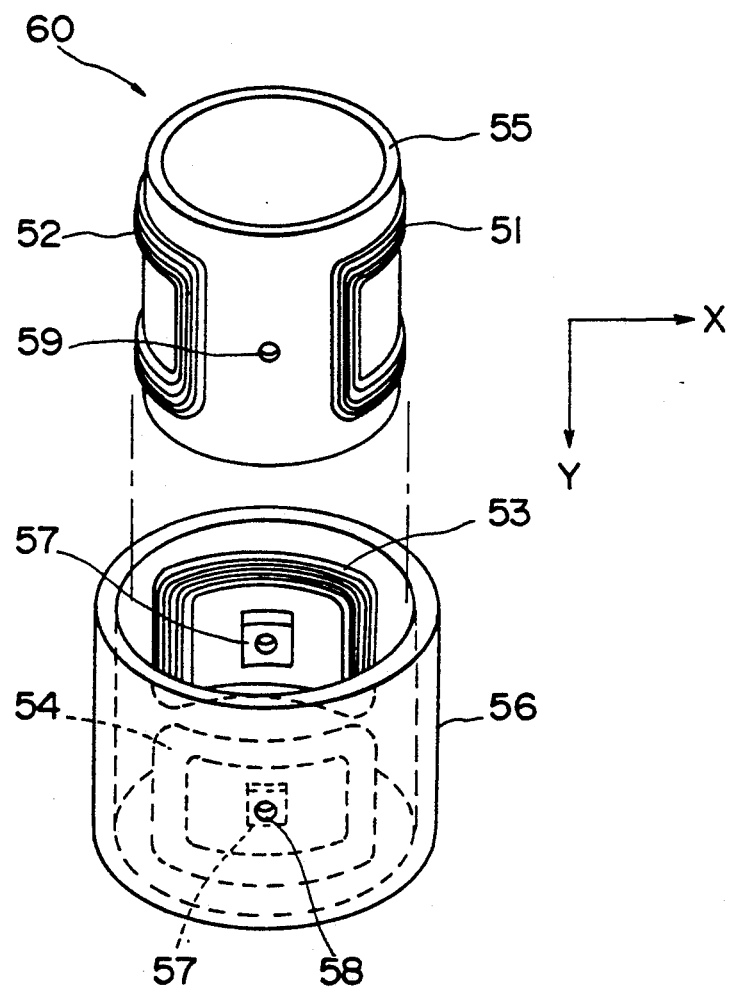
FIG. 5 is a perspective view of the construction of an electromagnetic deflector according to a first embodiment of the present invention.

FIG. 5 shows the electromagnetic deflector according to a first embodiment of the present invention.

Referring to FIG. 5, the electromagnetic deflector includes an inner bobbin 55, wherein a pair of separate windings 51 and 52 are provided on the outer surface thereof in opposed relationship with respect to each other in the X-direction. Further, there is provided an outer bobbin 56 surrounding the inner bobbin 55, and another pair of separate windings 53 and 54 are provided on the inner surface of the bobbin 56 in opposed relationship with respect to each other in the Y-direction. As usual, the inner bobbin 55 and the outer bobbin 56 are made of an insulating material such as $SiO_2$ glass or a glass that contains $SiO_2$. The inner bobbin 55 may have outer and inner diameters of 17 mm and 15 mm, respectively, while the outer bobbin 56 may have outer and inner diameters of 25 mm, and 20 mm respectively. Thereby, a gap of 1.5 mm is formed between the inner bobbin 55 and the outer bobbin 56.

Typically, the windings 51–54 are formed of a copper wire of 0.5 mm $\phi$, and are provided by laying the wire on the curved surface of the bobbin 55 or 56 along a circuitous path for a plurality of turns. As can be seen in FIG. 5, the windings 51 and 52 are formed like a saddle on the curved surface of the bobbins 55 and 56. It should be noted that the bobbin 56 does not have openings for introducing the coolant, contrary to the conventional electromagnetic deflector.

When the bobbins 55 and 56 are assembled, there is formed a gap of about 1.5 mm between the outer surface of the inner bobbin 55 and the inner surface of the outer bobbin 56 as already noted. When assembling the bobbins 55 and 56, the bobbin 55 is placed inside the bobbin 56, and the bobbins 55 and 56 are affixed to each other by a screw (not shown) inserted into a through hole 58 on the outer bobbin 56 and further into a corresponding threaded hole 59 on the inner bobbin 55. Further, the inner bobbin 55 and the outer bobbin 56 are separated from each other by a spacer 57 that is formed on the inner surface of the outer bobbin 56 in correspondence to the through hole 58.

Figure 1:
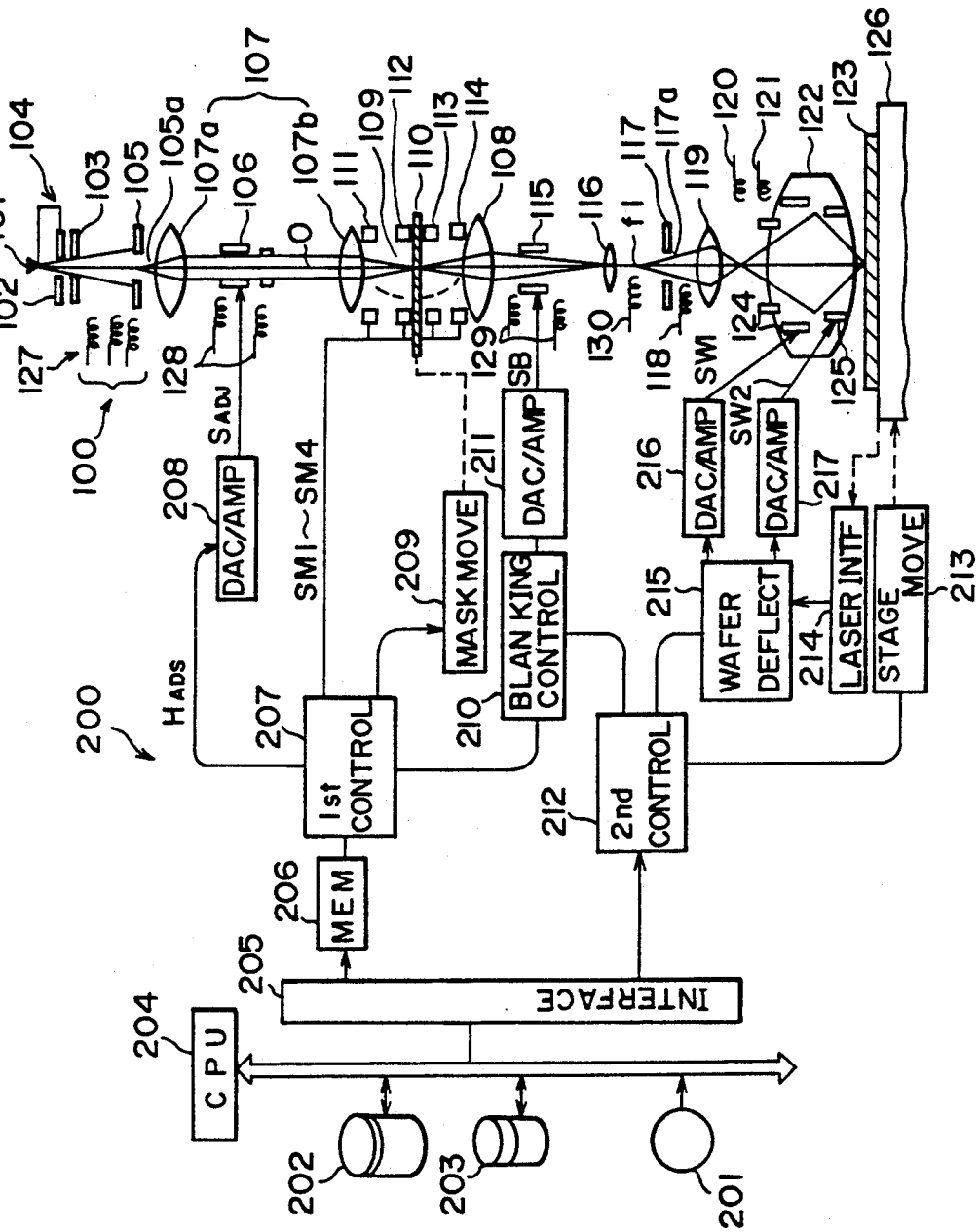
FIG. 1 is a diagram showing the construction of a conventional electron beam exposure system.
Figure 6:
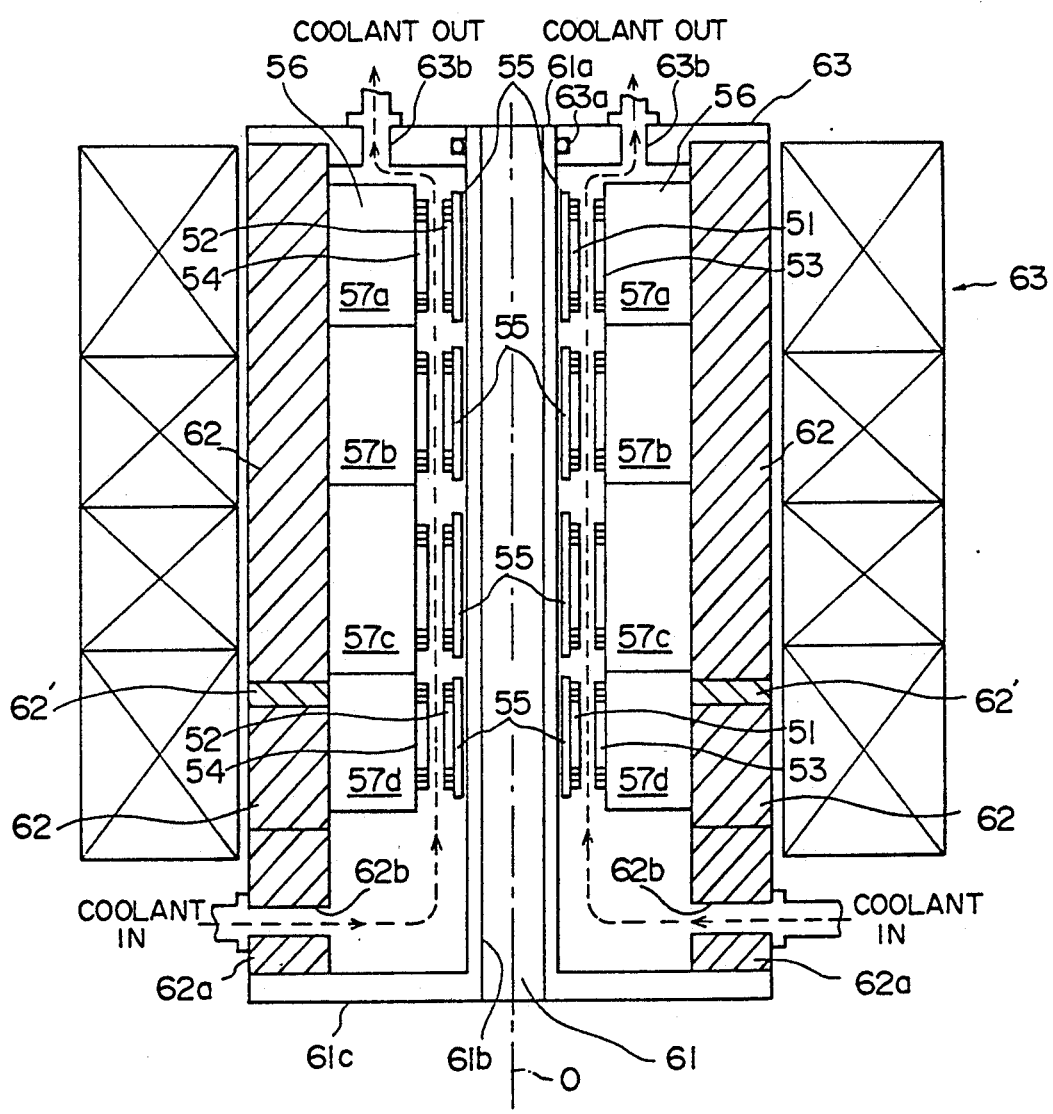
FIG. 6 is a diagram of the electromagnetic deflector of the first embodiment and the coolant flow therethrough, as used in an electron beam exposure system, of the present invention.

FIG. 6 shows the electromagnetic deflector in the state where it is mounted on the electron beam exposure system of FIG. 1.

Figure 4:
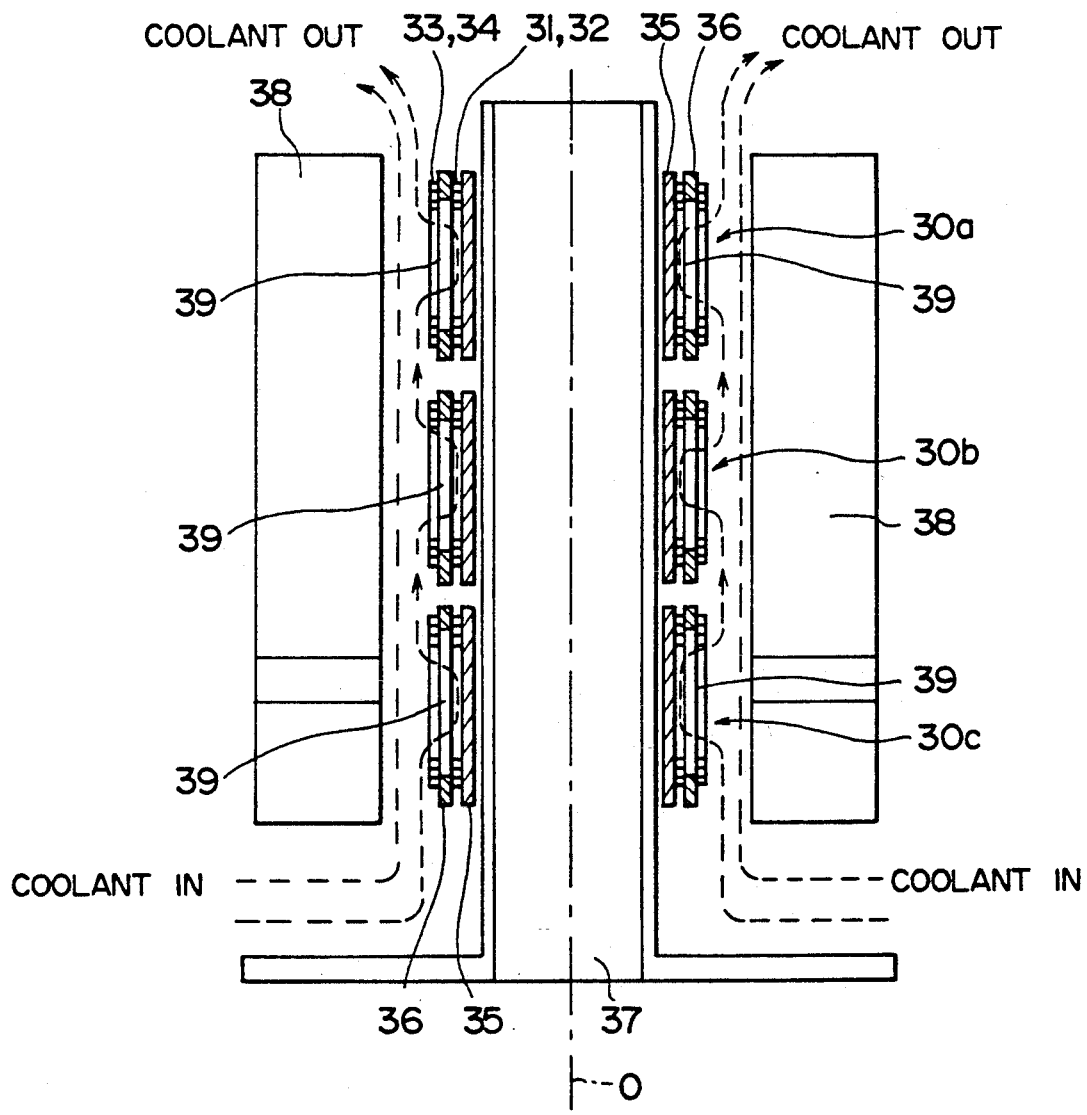
FIG. 4 is a diagram showing the cooling of the electromagnetic deflector in the conventional electron beam exposure system.

Referring to FIG. 6, there is provided an evacuated column 61 corresponding to the column 37 of FIG. 4 for passing the electron beam along the optical axis O. The column 61 includes a sleeve part 61a extending along the optical axis O and a base part 61c, wherein an evacuated space 61b is defined within the sleeve part 61a for passing the electron beam. Along the sleeve part 61a, there are disposed four electromagnetic deflectors 57a–57d, each having an identical construction as in the electromagnetic deflector of FIG. 5. Thus, each electromagnetic deflector includes an inner bobbin 55 that surrounds the sleeve part 61a of the evacuated column 61, and the windings 51 and 52 are held on the outer surface of the bobbin 55. Further, the outer bobbin 56 is placed so as to surround the inner bobbin concentrically. As described previously with reference to FIG. 5, the outer bobbin 56 carries the windings 53 and 54 on the inner surface thereof.

Surrounding the outer bobbin 56, there is provided a ferrite pole piece 62 that may comprise a number of stacked ferrite rings. Depending on the need, there may be provided a non-magnetic spacer ring 62' between the ferrite rings. The ferrite pole piece 62 defines a cylindrical space therewithin, and the outer bobbin 56 is mounted on the inner surface of the ferrite pole piece 62. Further, coils that acts as the electron lens are provided around the ferrite pole piece 62 as schematically indicated by a numeral 63.

As can be seen in FIG. 6, there is a space formed between the inner bobbin 55 and the outer bobbin 56 extending from the lowermost deflector 57d to the uppermost deflector 57a. The present invention achieves the cooling of the windings 51–54 by flowing a coolant through and along this space. In the illustrated example, a ferrite ring 62a is provided at the bottom part, and an inlet opening 62b is provided in the ferrite ring 62a for introducing the coolant. Typically, the ambient air, water, or helium gas is used for the coolant. At the top part of the uppermost deflector 57a, there is provided a cap 63 that is mounted on the column 61a by a seal ring 63a, and there is provided an outlet 63b in the cap 63 for exiting the coolant.

Figure 2:
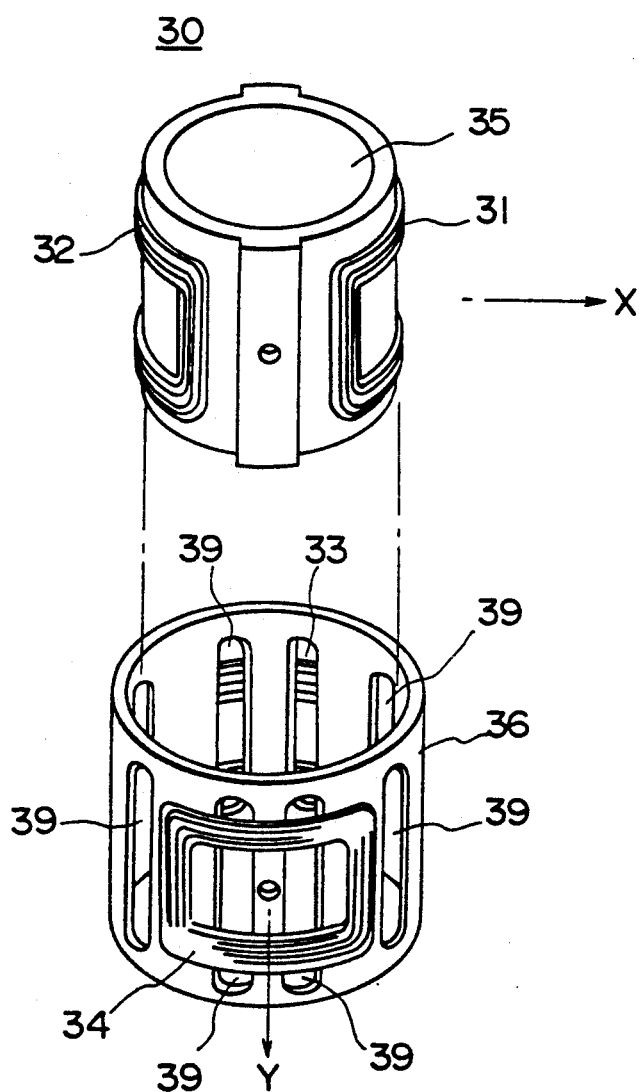
FIG. 2 is a diagram showing the construction of a conventional electromagnetic deflector used in the electron beam exposure system of FIG. 1 in a perspective view.
Figure 3A:
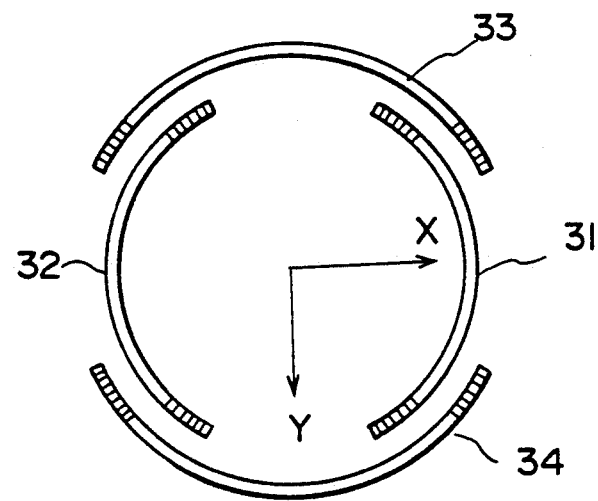
FIGS. 3(A) and 3(B) are diagrams showing the arrangement of windings in the electromagnetic deflector of FIG. 2 in two different designs.
Figure 3B:
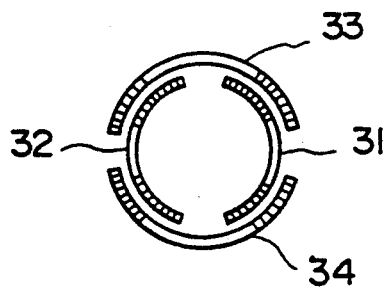

By assembling the electromagnetic deflector in the electron beam exposure system as indicated in FIG. 6, the cooling of the windings on the inner bobbin 55 and the cooling of the windings on the outer bobbin 56 are achieved simultaneously by flowing the coolant along a single path, or passageway through the space between the bobbins 55 and 56. Thereby, not only the outer bobbin 56 but also the inner bobbin 55 are cooled efficiently, without providing a slit such as the slit 39 of FIG. 2 on the outer bobbin 56.

Figure 7:
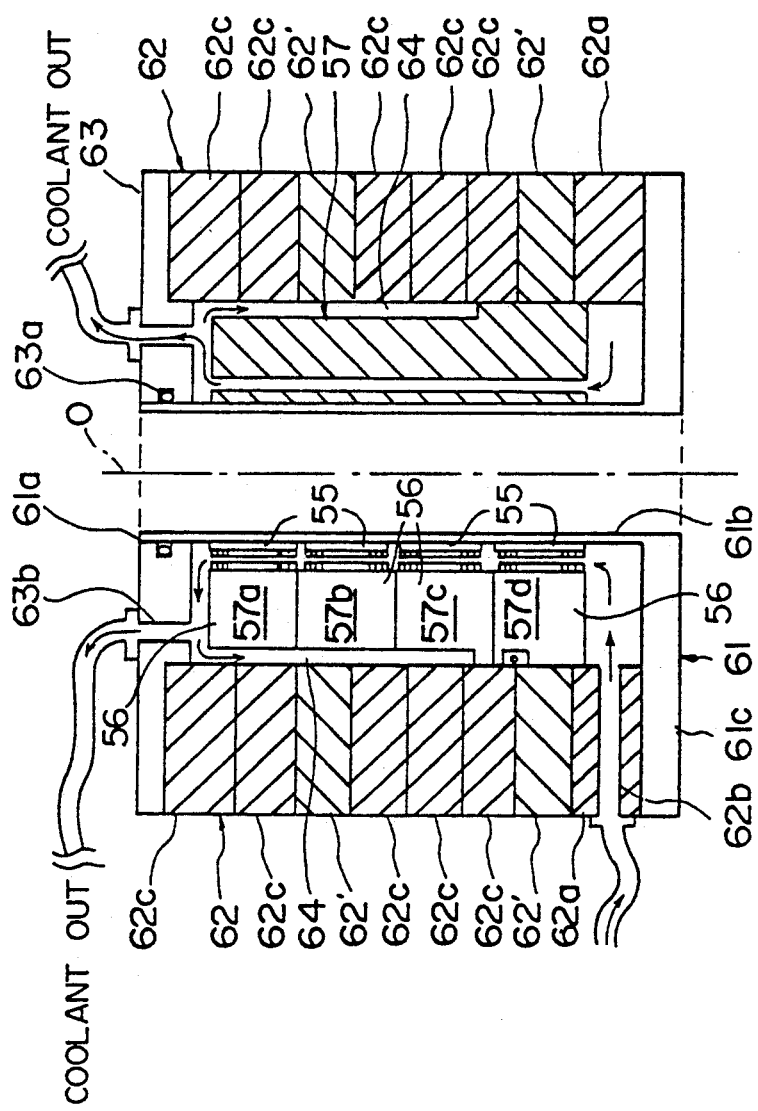
FIG. 7 is a diagram showing the construction of the electromagnetic deflector according to a second embodiment of the present invention.

FIG. 7 is a diagram corresponding to FIG. 6 and shows a second embodiment of the present invention.

Referring to FIG. 7 the pole piece 62 comprise a number of stacked ferrite rings 62c with a spacer ring 62' interposed at each of several appropriate locations. The coolant is introduced at the inlet 62b and exits at the outlet 63b after passing through the space between the inner bobbin 55 and the outer bobbin 56, similarly to the embodiment of FIG. 6.

In the present embodiment, it should be noted that there is formed a further space 64 between the inner surface of the pole piece 62 and the outer surface of the outer bobbin 56 in communication with the coolant passageway between the inner bobbin 55 and the outer bobbin 56 such that both the outer bobbin 56 and the pole piece 62 are cooled by the coolant. In the illustrated example, the space 64 and the the coolant passageway are in communication with each other at the top part of the electromagnetic deflector 57a. According to the present embodiment, the temperature rise of the pole piece caused by the radiation that is produced by the windings and propagated through the outer bobbin 56, is effectively eliminated.

Further, the present invention is not limited to the embodiments described heretofore, but various variations and modifications can be made without departing from the scope of the invention.

What is claimed is:

1. An electron beam exposure system for writing a pattern on an object by a focused electron beam, comprising:

beam source means for producing an electron beam such that the electron beam travels toward said object along a predetermined optical axis;

an evacuated column for accommodating said beam source means and said object, said evacuated column surrounding said optical axis and extending from said beam source means to said object along said optical axis;

focusing means for focusing the electron beam on said substrate; and an electromagnetic deflector supplied with a control signal for deflecting said electron beam in response to said control signal, said electromagnetic deflector comprising:

an inner sleeve surrounding said evacuated column;

first and second, mutually separate windings provided on an outer surface of said inner sleeve, said first and second windings being disposed in opposed relationship with respect to each other across said optical axis in a first direction that is substantially perpendicular to said optical axis of the electron beam, said first and second windings producing a magnetic field for deflecting said electron beam in said first direction;

an outer sleeve surrounding said inner sleeve and having a space therebetween defining a coolant passageway therebetween, third and fourth, mutually separate windings provided on an inner surface of said outer sleeve in opposed relationship with respect to each other across said optical axis in a second direction substantially perpendicular to said optical axis, said third and fourth windings producing a magnetic field for deflecting said electron beam in said second direction, inlet means for introducing a coolant into and so as to flow through said coolant passageway, and outlet means for exiting said coolant from said coolant passageway.

2. An electron beam exposure system as claimed in claim 1, wherein said focusing means comprises an electron lens, said electron lens comprising a magnetic pole piece and a winding provided on said magnetic pose piece, said magnetic pole piece being defined by an inner surface extending along said optical axis, said outer sleeve being mounted on said inner surface of said magnetic pole piece.

3. An electron beam exposure system as claimed in claim 2, further comprising a space between said inner surface of said magnetic pole piece and said outer sleeve, said space being in communication with said coolant passageway such that said space is filled by a flow of said coolant thereinto from said coolant passageway.

4. An electron beam exposure system as claimed in claim 1 in which said magnetic deflector comprises a plurality of component magnetic deflectors disposed at successive positions and in axial alignment along said optical path, said coolant passageway being defined along said evaluated column such that said plurality of component magnetic deflectors are cooled consecutively by the flow of said coolant therethrough, the respective said first through fourth windings of each component magnetic deflector being cooled simultaneously by said flow of coolant.

5. An electromagnetic deflector for deflecting an electron beam, comprising:

an inner sleeve having outer and inner surfaces, said inner surface of said inner sleeve defining a passageway for said electron beam;

first and second, mutually separate windings provided on said outer surface of said inner sleeve in opposed relationship with respect to each other in a first direction across said passageway for the electron beam;

an outer sleeve having outer and inner surfaces and disposed coaxially and in surrounding and spaced relationship with respect to said inner sleeve and defining a corresponding space therebetween;

third and fourth, mutually separate windings disposed on said inner surface of said outer sleeve in opposed relationship with respect to each other in a second direction across said passageway for the electron beam;

spacer means for separating said inner sleeve and said outer sleeve to maintain the space between said outer surface of said inner sleeve and said inner surface of said outer sleeve;

inlet means for introducing a coolant into and so as to flow through said space; and outlet means for exiting said coolant after flowing through said space.

6. A method of cooling an electromagnetic deflector having an inner sleeve with outer and inner surfaces, said inner surface of said inner sleeve defining a passageway for said electron beam, first and second mutually separate windings provided on said outer surface of said inner sleeve in opposed relationship with respect to each other in a first direction across said electron beam passageway; an outer sleeve having outer and inner surfaces and disposed coaxially and in surrounding and spaced relationship with respect to said inner sleeve and defining a corresponding space therebetween, third and fourth mutually separate windings provided on said inner surface of said outer sleeve in opposed relationship with each other in a second direction across said electron beam passageway; and a spacer for maintaining the space between said outer surface of said inner sleeve and said inner surface of said outer sleeve, said method comprising the steps of:

introducing a coolant into said space;

causing said coolant to flow through said space so as to contact and thereby to cool said first through fourth windings; and exiting said coolant from said space.

7. A method for deflecting an electron beam by an electromagnetic deflector having an inner sleeve with outer and inner surfaces, said inner surface of said inner sleeve defining a passageway for said electron beam; first and second mutually separate windings provided on said outer surface of said inner sleeve in opposed relationship with respect to each other in first direction across said electron beam passageway; an outer sleeve having outer and inner surfaces and disposed coaxially and in surrounding and spaced relationship with respect to said inner sleeve and defining a corresponding space therebetween, third and fourth mutually separate windings provided on said inner surface of said outer sleeve in opposed relationship with each other in a second direction across said electron beam passageway; and a spacer for maintaining the space between said outer surface of said inner sleeve and said inner surface of said outer sleeve, said method comprising the steps of:

flowing a coolant through said space for cooling said first through fourth windings simultaneously; and
supplying a drive current selectively to said first and second windings and to said third and fourth windings for deflecting the electron beam.

* * * * *